United States Patent [19]

Shaulov

[11] Patent Number: 4,501,967
[45] Date of Patent: Feb. 26, 1985

[54] BROAD BAND PYROELECTRIC INFRARED DETECTOR

[75] Inventor: Avner Shaulov, Monsey, N.Y.

[73] Assignee: North American Philips Corporation, New York, N.Y.

[21] Appl. No.: 442,804

[22] Filed: Nov. 18, 1982

[51] Int. Cl.³ .............................................. G01J 5/24
[52] U.S. Cl. .................................................. 250/338
[58] Field of Search ................... 250/338 PY, 338 FE; 374/177, 121 (U.S. only)

[56] References Cited

U.S. PATENT DOCUMENTS

| | | | |
|---|---|---|---|
| 3,748,624 | 7/1973 | Yazuma et al. | 338/30 |
| 3,813,550 | 5/1974 | Abrams et al. | 250/338 |
| 4,024,560 | 5/1977 | Miller et al. | 357/23 |
| 4,044,251 | 8/1977 | Taylor et al. | 250/342 |

FOREIGN PATENT DOCUMENTS 2722737 12/1977 Fed. Rep. of Germany .
1267428  3/1972 United Kingdom .

OTHER PUBLICATIONS

A. S. Martynyuk, E. P. Nikolaev and V. K. Novik, "A method of reducing the non-linearity of pyroelectric radiation detectors" *Sov. J. Opt. Technol.* vol. 42, No. 1, (Jan. 1975), pp. 35-37.

V. P. Singh and A. Van Der Ziel "Capacitive Bolometer Effect in the Paraelectric Phase of Triglycine Sulfate" *Ferroelectrics* vol. 15, Nos. 3-4 (1977) pp. 135-142.

*Primary Examiner*—Janice A. Howell
*Assistant Examiner*—Constantine Hannaher
*Attorney, Agent, or Firm*—Marc D. Schechter

[57] ABSTRACT

An infrared thermal detector includes an infrared thermal sensing element, a load resistor, and a voltage supply means. The infrared thermal sensing element is a pyroelectric material whose electrical conductivity changes with temperature. The circuit and device parameters are chosen such that the detector will have frequency response over a broad band from dc (0 Hertz) to a high frequency determined by the electronic time constant of the circuit. The detector thus has all the advantages of either a pyroelectric detector without a chopper, or a thermistor bolometer having a fast response time.

17 Claims, 5 Drawing Figures

BROAD BAND PYROELECTRIC INFRARED DETECTOR

BACKGROUND OF THE INVENTION

The invention relates to electronic infrared thermal sensors and to electronic circuits for detecting the outputs of such sensors.

Infrared thermal detectors have been and are used in a wide variety of applications which require room temperature operation and a uniform sensitivity over a wide spectral range. Among the most popular thermal detectors are the thermistor bolometer and the pyroelectric detector.

The thermistor bolometer is a thermal detector whose electrical resistance varies as a function of temperature. By measuring the resistance of the thermistor, its temperature can be deduced. In thermistors the electrical resistance usually decreases as the temperature of the thermistor increases.

The pyroelectric detector, on the other hand, is a thermal detector whose spontaneous polarization varies as a function of temperature. The spontaneous polarization, however, cannot be measured in equilibrium because it is exactly cancelled by the rearrangement of free charge in the material. Nevertheless, changes in the spontaneous polarization can be measured to detect changes in the temperature of the pyroelectric detector. Usually, with increasing temperature, the spontaneous polarization decreases.

Due to the different thermal effects on which operation of these two detectors is based, each detector has a different frequency response. The thermistor, in common with many other thermal detectors, is most sensitive at frequencies below the thermal relaxation frequency, $\omega_T$, which is typically between 1 and 100 Hertz. Curve 10 in FIG. 1 is a plot of the logarithm of the responsivity of a typical thermistor bolometer versus the logarithm of the frequency of a sinusodially modulated incident radiation power to be detected. Curve 10 shows the responsivity remaining fairly constant up to the thermal relaxation frequency. Above this frequency the responsivity drops off quickly.

In contrast to the thermistor bolometer, pyroelectric detectors are most sensitive at frequencies above the thermal relaxation frequency. Curve 12 of FIG. 1 shows a plot of the logarithm of the responsivity of a typical pyroelectric detector versus the logarithm of the frequency of a sinusoidally modulated incident radiation power to be detected. Above the thermal relaxation frequency to a frequency, $\omega_e$, which is determined by the electronic time constant of the circuit, the responsivity of the pyroelectric detector is relatively flat. At frequencies below the thermal relaxation frequency or above $\omega_e$, the responsivity of the pyroelectric detector quickly drops off. It should be noted that in FIG. 1, although both curves 10 and 12 are shown on a single graph, the scales for each curve are not necessarily the same.

An example of a pyroelectric detector appears in U.S. Pat. No. 4,024,560 (Miller et al). Miller et al. disclose a pyroelectric field effect radiation detector. In FIGS. 1 and 2, for example, the pyroelectric material is electrically connected in series with a source of voltage (e.g. poling circuit 44) and with a load resistance (e.g. the resistance across the source and gate of the FET). Several possible materials are disclosed for the Miller et al pyroelectric detector, among which are triglycine sulfate (TGS), strontium-barium niobate (SBN), lithium niobate, and lithium tantalate.

Many materials are known which can be used as the sensing elements of thermistor bolometers, and many materials are known which can be used as pyroelectric detectors. Within these two classes of materials is a single subset of materials which exhibit both thermistor and pyroelectric properties. That is, the materials in this subset exhibit both changes in their electrical resistance with changes in temperature, and changes in their spontaneous electrical polarization with changes in temperature. Known pyroelectric materials whose electrical conductivity is strongly temperature dependent include single crystals of boracites, sodium nitrite ($NaNO_2$), tin-hypothiodiphosphate ($Sn_2P_2S_6$), lead germanate ($Pb_5Ge_3O_{11}$), lithium ammonium sulfate ($LiNH_4SO_4$), and some ferroelectric ceramics.

SUMMARY OF THE INVENTION

It is an object of the invention to provide an infrared thermal detector having a relatively large and substantially flat frequency response both above and below the thermal relaxation frequency.

It is another object of the invention to provide a pyroelectric detector which does not need a chopper.

It is a further object of the invention to provide a thermistor bolometer having a fast response time.

According to the invention a unique broadband infrared thermal detector comprises a combined thermistor bolometer and a pyroelectric detector. The frequency response of this "Pyroelectric Thermistor Bolometer" (PTB) is the combination of the frequency responses of a thermistor bolometer and a pyroelectric detector. Thus, it can provide high sensitivity at frequencies both above and below the thermal relaxation frequency. By adjusting the sensitivity of the thermistor and pyroelectric components, the PTB can yield a flat frequency response over a broadband from dc (0 Hertz) to a high frequency determined by the electronic time constant of the PTB circuit.

An infrared thermal detector according to the invention comprises an infrared thermal sensing element, a load resistor, and a voltage source. The thermal sensing element comprises a pyroelectric material whose electrical conductivity changes with temperature. The sensing element has two substantially planar surfaces on which first and second electrodes are provided opposite each other.

The load resistor has first and second electrodes, one of which is electrically connected to an electrode of the sensing element. The voltage source is then connected to the remaining electrodes of the sensing element and the loading resistor.

In order to adjust the circuit to produce a flat frequency response both above and below the thermal relaxation frequency, the circuit is provided with variable voltage supply means, or a variable load resistor, or both. The load resistor and bias voltage are then adjusted (or they are initially chosen) so that at the "equilibrium" temperature of operation of the sensing element, the PTB constant, k, (defined below) is greater than zero. Preferably, k is between 0.1 and 5. Ideally, k is approximately equal to one.

Alternatively, the PTB need not be provided with a variable voltage or a variable resistor if the values of the applied voltage and the load resistor are initially chosen so that at the temperature of operation of the PTB, $k>0$.

In all embodiments of the invention, the polarity of the voltage source must be chosen so that the pyroelectric component and the thermistor component of the PTB signal, due to a given change in temperature, are of the same sign (positive or negative). This means that when the spontaneous electric polarization decreases with increasing temperature, and the electrical resistance decreases with increasing temperature, the bias voltage should generate an electric field having a component which is directed opposite the spontaneous polarization. With small bias voltages and materials having high coercive fields, there is little danger of depoling the material (if it is operated far from its Curie Point).

DESCRIPTION OF THE PREFERRED EMBODIMENTS

Figure 1:
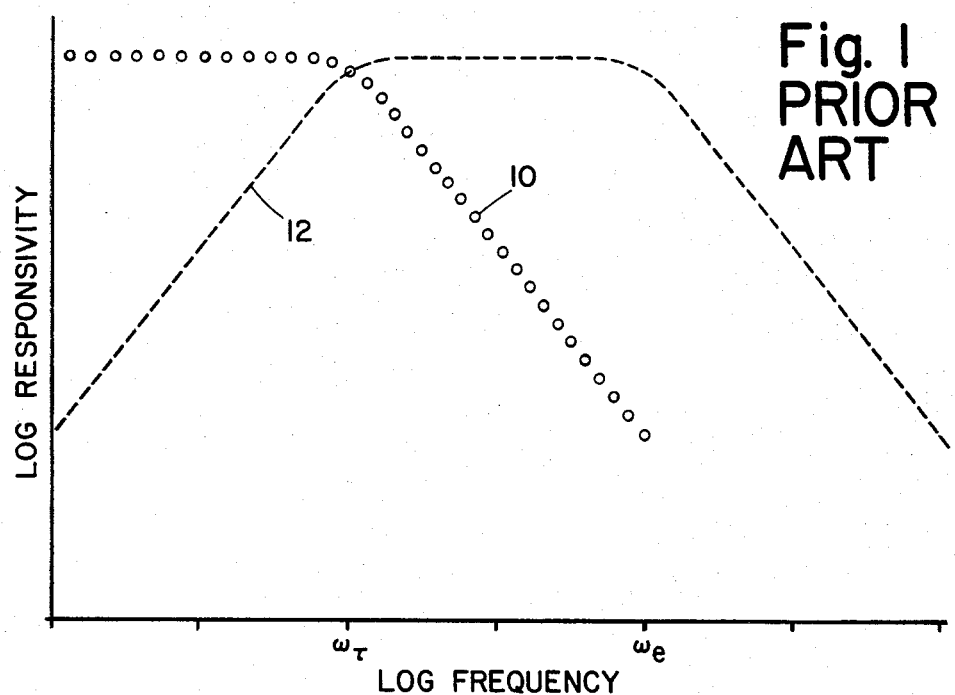
FIG. 1 is a plot of the logarithm of the responsivity versus the logarithm of the input signal frequency for a known thermistor bolometer, and for a known pyroelectric detector.
Figure 2:
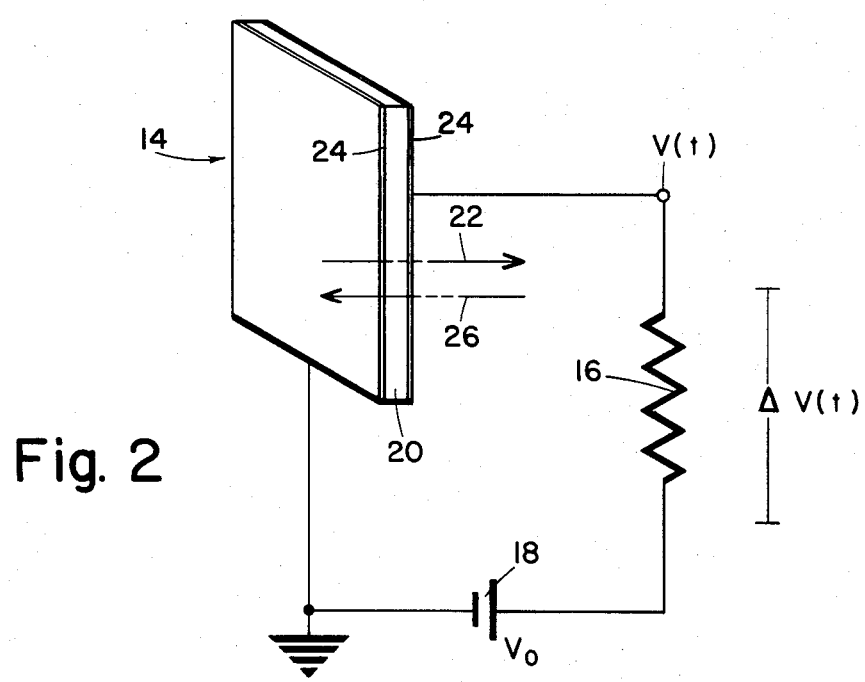
FIG. 2 is a schematic representation of a pyroelectric thermistor bolometer according to the invention.

A pyroelectric thermistor bolometer according to the invention is shown in FIG. 2. The detector includes a PTB sensing element 14, a load resistor 16, and a voltage source 18. Load resistor 16 and voltage source 18 may be either fixed or variable. Their operational values can be selected in accordance with the criteria which are discussed further below. Both of these elements of the invention are conventional electronic parts, and are readily available.

The PTB sensing element according to the invention comprises a pyroelectric material 20 whose electrical conductivity changes with temperature. Examples of pyroelectric materials in which the electrical conductivity is strongly temperature dependent are crystals of boracites, sodium nitrite, tin-hypothiodiphosphate, lead germanate, lithium ammonium sulfate, and some ferroelectric ceramics. The invention was actually constructed utilizing a copper-chloride boracite crystal. However, it is believed that less expensive materials, such as ferroelectric ceramics or tin-hypothiodiphosphate, would be preferable to the copper-chloride boracite.

All pyroelectric materials have a pyroelectric axis along which they are spontaneously polarized. The spontaneous polarization at any part of the material may be in either of the two opposite directions along this axis. According to the invention, the pyroelectric material must have a net polarization (arrow 22) in one direction (pointing within the material from the negative end of the net dipole moment to the the positive end thereof).

In order to construct a pyroelectric thermistor bolometer detector, the pyroelectric material 20 is provided with electrodes 24 on opposite planar faces of the pyroelectric material. The electrodes are oriented transverse to the pyroelectric axis. For example, the electrodes in FIG. 2 are perpendicular to the pyroelectric axis. A first electrode of the PTB sensing element 14 is then connected to a first electrode on the load resistor 16. The voltage source 18 is then connected to the remaining electrodes of the sensing element 14 and the load resistor 16.

According to the invention, the polarity of the voltage source 18 depends upon the direction of polarization, the sign of the pyroelectric coefficient, and the sign of the temperature coefficient of resistance of the PTB sensing element 14. The polarity of voltage source 18 must be chosen so that for a given change in temperature of the PTB sensing element 14, both the pyroelectric effect and the thermistor effect will tend to either increase or decrease the circuit current. That is, for a given change in temperature, both the pyroelectric effect and the thermistor effect should reinforce each other, rather than oppose each other.

In the situation where an increase in temperature decreases the spontaneous polarization and an increase in temperature decreases the resistance of the sensing element, the polarity of voltage source 18 should generate an electric field across the PTB sensing element 14 which is directed opposite to the direction of spontaneous polarization of the sensing element. This is shown in FIG. 2 where the net polarization directed is shown by arrow 22, and the polarity of voltage source 18 generates an electric field pointing in a direction shown by arrow 26.

ANALYSIS OF OPERATION

To analyze the operation of a pyroelectric thermistor bolometer, we will start with a PTB sensing element whose spontaneous polarization decreases as the temperature of the element increases, and whose resistance decreases as the temperature of the element increases. (In general, of course, the analysis holds whether the spontaneous polarization and the resistance either increase or decrease with increasing temperature.) We will assume that the sensing element is located in an environment having a temperature of $T_o$, which is also the average equilibrium temperature of the sensing element. We further assume that the temperature of the environment in which the PTB is situated is constant (or changing only very little and very slowly).

The radiation power absorbed in the PTB sensing element as a function of time, t, is given by the function W(t). We will assume that the thermal power being absorbed by the sensing element is small. Now, the temperature of the element will be principly determined by two physical phenomena: (1) energy absorption, where the temperature change, dT, is equal to the net energy absorbed by the element divided by the heat capacity, $C_T$, of the element $$dT = \frac{W(t)dt}{C_T};$$

and (2) heat conduction, where the net energy released by the element over a small period of time (i.e the net power) is equal to the difference in temperature between the element and its environment ($T-T_o=\Delta T$), multiplied by the dissipation constant, G, of the sensing element. (The dissipation constant is the thermal conductivity between the sensing element and its surroundings.) Thus, $$G\Delta T = \text{power dissipated}$$

The following equation now approximates the relationship between the temperature of the element and the absorbed power.

$$C_T \frac{d(\Delta T)}{dt} + G\Delta T = W(t) \quad (1)$$

(where $dT=d(\Delta T)=d(T-T_o)$ due to the above assumptions). This can be rewritten as $$\frac{d(\Delta T)}{dt} + \frac{\Delta T}{\tau_T} = \frac{W(t)}{C_T} \quad (2)$$

where the thermal time constant $\tau_T=(C_T/G)$. $\tau_T$ is a time constant which is analogous to the RC time constant in electrical circuits.

Having determined the temperature behavior of the PTB sensing element as a function of the radiation power absorbed by the element, we next turn to the electrical behavior, of the electrical circuit shown in FIG. 2, as a function of the temperature of the PTB sensing element.

For a pyroelectric material, a rise in temperature $d(\Delta T)$ produces a change, dP, in polarization, P, of $$dP = -pd(\Delta T)$$

where p is the pyroelectric coefficient of the material. According to this definition of the pyroelectric coefficient, a positive pyroelectric coefficient means that the polarization decreases with increasing temperature. According to other definitions, a positive pyroelectric coefficient means that the polarization increases with increasing temperature. One should be careful to determine which definition applies in any given instance.

For a thermistor, a rise in temperature $d(\Delta T)$ produces a change, dR, in resistance, R, of $$dR = \alpha R_o d(\Delta T)$$

where $R_o$ is the resistance of the thermistor at the temperature of the surrounding environment, and $\alpha$ is the temperature coefficient of resistance (which is substantially constant for the small changes in temperature which we have assumed, above). According to this definition of the temperature coefficient of resistance (TCR), a positive TCR means that the resistance increases with increasing temperature. According to other definitions, a positive TCR means that the resistance decreases with increasing temperature. One should be careful to determine which definition applies in any given instance.

Now, returning to the electrical circuit shown in FIG. 2, we can compute the time-varying voltage across the load resistor, $R_L$. First, the total voltage across $R_L$ is $V_o-V=IR_L$, where I is the total circuit current and V is the voltage drop across the PTB sensing element. Therefore, the small signal (time-varying) voltage, $\Delta V$, across the load, $R_L$, is given by the total voltage ($V_o-V$) less the steady-state voltage ($V_oR_L/R_o+R_L$):

$$\Delta V = V_o - V - \frac{V_o R_L}{R_o + R_L}$$

The total circuit current can be derived by separately calculating the conduction current and the displacement current through the PTB sensing element. From this, the time-varying circuit current can be computed.

First, the conduction current, $I_c$, through the PTB is $$I_c = (V/R), \quad (3)$$

where R is the electrical resistance of the PTB.

Next, the displacement current, $I_d$, through the PTB sensing element is $$I_d = A(dD/dt)$$

where D is the electric displacement vector, and A is the cross-sectional area of the PTB sensing element between its electrodes. Since $D=\epsilon_o E + P$, $$I_d = \epsilon_o A \frac{dE}{dt} + A\left(\frac{dP}{dE}\frac{dE}{dt} + \frac{dP}{dT}\frac{dT}{dt}\right)$$

$$= A\frac{dE}{dt}\left(\epsilon_o + \frac{dP}{dE}\right) + A\frac{dP}{dT}\frac{dT}{dt}$$

By definition, the dielectric constant, $\epsilon$, of the PTB sensing element is equal to $$\left(\epsilon_o + \frac{dP}{dE}\right).$$

and the pyroelectric coefficient, p, is equal to $-dp/dT$. Therefore, $$I_d = \epsilon A \frac{dE}{dt} - pA\frac{dT}{dt}$$

Also, by definition $E=(-V/L)$, and the capacitance $C=(\epsilon A/L)$ for a parallel plate capacitor having a distance L between the plates. Therefore since $dT=d(\Delta T)$, $$I_d = -C\frac{dV}{dt} - pA\frac{d(\Delta T)}{dt} \quad (4)$$

Combining equations (3) and (4) gives use the total current, I, through the circuit.

$$I = I_c + (-I_d) = \frac{V}{R} + C\frac{dV}{dt} + pA\frac{d(\Delta T)}{dt}$$

(The negative of the displacement current is used because in the derivation of the displacement current (a) a positive current is defined to flow in the direction of the positive polarization vector, and (b) the potential difference is defined as the work per unit charge done in moving a positive charge opposite to the direction of the electric field so that a positive current flows from low potential to higher potential. In FIG. 2, the positive polarization vector 22 is directed opposite the chosen direction of positive current flow. The direction of increasing potential is also opposite the chosen direction of positive current flow.)

Since we also know that $V=V_o-IR_L$, by inserting the expression for the total current into this equation and rearranging terms we find that $$V = \frac{RR_L}{R+R_L}\left[\frac{V_o}{R_L} - C\frac{dV}{dt} - pA\frac{d(\Delta T)}{dt}\right]$$

Having found an expression for V, we can now take the last step to find the small signal voltage, $\Delta V$, across the load resistor. By definition, $$\Delta V = V_o - V - \frac{V_o R_L}{R_o + R_L} \quad (4\text{-a})$$

$$= \frac{V_o R_o}{R_o + R_L} - V$$

Substituting the expression for V yields $$\Delta V = \frac{V_o R_o}{R_o + R_L} - \frac{RR_L}{R+R_L}\left[\frac{V_o}{R_L} - C\frac{dV}{dt} - pA\frac{d(\Delta T)}{dt}\right].$$

Rearranging terms, $$-\Delta V\left[\frac{1}{R} + \frac{1}{R_L}\right] =$$

$$\frac{V_o}{R_L} \cdot \frac{R_L(R-R_o)}{R(R_o+R_L)} - C\frac{dV}{dt} - pA\frac{d(\Delta T)}{dt},$$

or:

$$C\frac{dV}{dt} - \Delta V\left[\frac{1}{R} + \frac{1}{R_L}\right] =$$

$$\frac{V_o}{R_o + R_L}\left[1 - \frac{R_o}{R}\right] - pA\frac{d(\Delta T)}{dt}.$$

Now, from equation (4-a) we know that $dV=-d(\Delta V)$. We also know that $R=R_o+\alpha R_o\Delta T$. Neglecting second order and higher order effects[1], we thus arrive at $$-C\frac{d(\Delta V)}{dt} - \Delta V\left[\frac{1}{R_o} + \frac{1}{R_L}\right] = \frac{V_o \alpha \Delta T}{R_o + R_L} - pA\frac{d(\Delta T)}{dt} \quad (5)$$

If we define the electronic time constant, $\tau_e$, of the circuit $$\tau_e = \frac{C}{\frac{1}{R_L} + \frac{1}{R_o}}.$$

and if we define the PTB time constant, $\tau$, of the circuit $$\tau = -\frac{pA(R_o + R_L)}{\alpha V_o}. \quad (5.5)$$

then equation (5) reduces to $$\frac{d(\Delta V)}{dt} + \frac{\Delta V}{\tau_e} = \frac{pA}{C}\left[\frac{d(\Delta T)}{dt} + \frac{(\Delta T)}{\tau}\right] \quad (6)$$

1. $\frac{1}{R} = \frac{1}{R_o(1+\alpha\Delta T)} = \frac{1}{R_o}[1 - \alpha\Delta T + 2\alpha^2\Delta T^2 + \ldots]$ Thus, $\frac{\Delta V}{R} = \frac{1}{R_o}[\Delta V - \alpha\Delta V\Delta T\ldots].$ $\Delta V \Delta T$ is a second order term (both $\Delta V$ and $\Delta T$ change with changes in the input radiation) so $(\Delta V/R)\approx(\Delta V/R_o)$.

Similarly, $(R_o/R)=1-\alpha\Delta T+2\alpha^2\Delta T^2\approx(1-\alpha\Delta T)$. In equation (6), $\tau_e$ is the RC time constant of the pyroelectric circuit. This is the same electronic time constant which would appear in the analysis of a pyroelectric detector which does not also operate, according to the invention, as a PTB. Moreover, the thermal time constant in equation (2) is the same constant which would appear in the analysis of either a pyroelectric detector or a thermistor bolometer, neither of which also operate as a PTB.

In contrast, the PTB time constant, $\tau$, has never appeared in analyses of prior detectors. Physically, $\tau$ is the charge per degree due to a change in polarization divided by the current per degree due to a change in resistance. Thus, $\tau$ reflects the relative contributions to the output signal of the pyroelectric effect and the thermistor effect.

Equations (2) and (6) can be solved using the well-known Laplace transform method. Assuming initial conditions of $\Delta T(0)=0$ and $\Delta V(0)=0$, the Laplace transforms of equations (2) and (6) are:

$$\left(s + \frac{1}{\tau_T}\right) t(s) = \frac{w(s)}{C_T} \quad (2\text{a})$$

$$\left(s + \frac{1}{\tau_e}\right) v(s) = (pA/C)\left(s + \frac{1}{\tau}\right) t(s) \quad (6\text{a})$$

where t(s), w(s) and v(s) are the Laplace transforms of $\Delta T(t)$, $W(t)$, and $\Delta V(t)$, respectively.

Combining equations (2a) and (6a) yields $$v(s)=H(s)w(s)$$

where the transfer function H(s) is $$H(s) = \frac{\frac{pA}{CC_T}\left(s + \frac{1}{\tau}\right)}{\left(s + \frac{1}{\tau_e}\right)\left(s + \frac{1}{\tau_T}\right)} \quad (7)$$

By taking the inverse Laplace transform of v(s), the response to any excitation function W(t) can be obtained.

RESPONSE TO A STEP FUNCTION

If, in the circuit shown in FIG. 2, at some chosen time (t=0) the PTB sensing element 14 is exposed to an increased amount of infrared radiation which continues thereafter at a constant rate of absorption (namely, W(t)=0 for t<0, and W(t)=W$_o$ for t>0), one obtains $$r(s) = \frac{\frac{pAW_o}{CC_T}\left(s + \frac{1}{\tau}\right)}{s\left(s + \frac{1}{\tau_c}\right)\left(s + \frac{1}{\tau_T}\right)}$$

The inverse Laplace transform yields $$\Delta V(t) = \frac{pAW_o\theta\tau_T}{CC_T(1 - \theta)}\left[(1 - k)e^{\frac{-t}{\tau_T}} - (1 - k\theta)e^{\frac{-t}{\tau_c}} + k(1 - \theta)\right] \quad (9)$$

where $\theta = \frac{\tau_c}{\tau_T}$ and $k = \frac{\tau_T}{\tau}$.

where $\theta=(\tau_c/\tau_T)$ and $k=(\tau_T/\tau)$.

Figure 3:
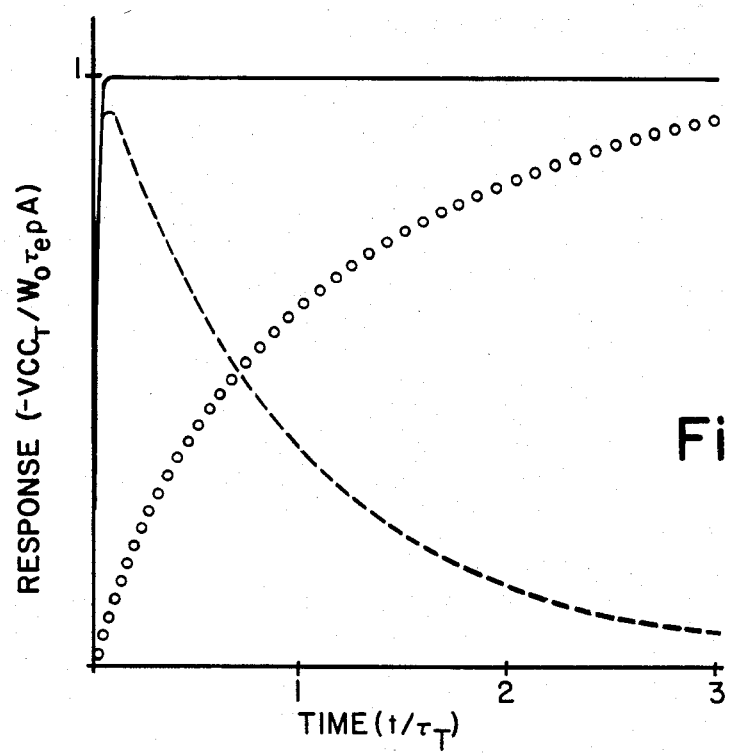
FIG. 3 is a graph of the response to a step function of a pyroelectric thermistor bolometer according to the invention.

The response, $\Delta V(t)$, as a function of time is plotted in FIG. 3, together with the separate contributions of the pyroelectric and thermistor components of the output signal. The curves shown are calculated for $\theta=0.01$ and $k=1$, which can be obtained by adjusting the circuit parameters, selecting suitable physical dimensions for the PTB sensing element, and by selecting a suitable material for the sensing element.

Referring again to FIG. 3, while the thermistor component of the response rises slowly with a time constant $\tau_T$ to a steady value, the pyroelectric component rises quickly with a time constant approximately equal to $\tau_c$ to a peak value. Thereafter, the pyroelectric component decays slowly to zero with a time constant $\tau_T$.

When the load resistor and the bias voltage, $V_o$ are chosen so that $k=1$, the slow decay of the pyroelectric response is compensated by the slow rise of the thermistor response so that the combined response rises fast to a steady value. The fast rise of the step response to a steady value is an outstanding trait of the PTB.

FREQUENCY RESPONSE

The steady state response of the circuit shown in FIG. 2 to a sinusoidal input of frequency $\omega$ is also a sinusoid of frequency $\omega$. The ratio of the amplitude of the response to that of the input is the magnitude of the transfer function H(s) when j$\omega$ is substituted for s. Hence, the responsivity r($\omega$) of the PTB is given by $$r(\omega) = \frac{pA\tau_c}{CC_T}\left[\frac{k^2 + \omega^2\tau_T^2}{(1 + \omega^2\tau_c^2)(1 + \omega^2\tau_T^2)}\right]^{\frac{1}{2}} \quad (10)$$

Figure 4:
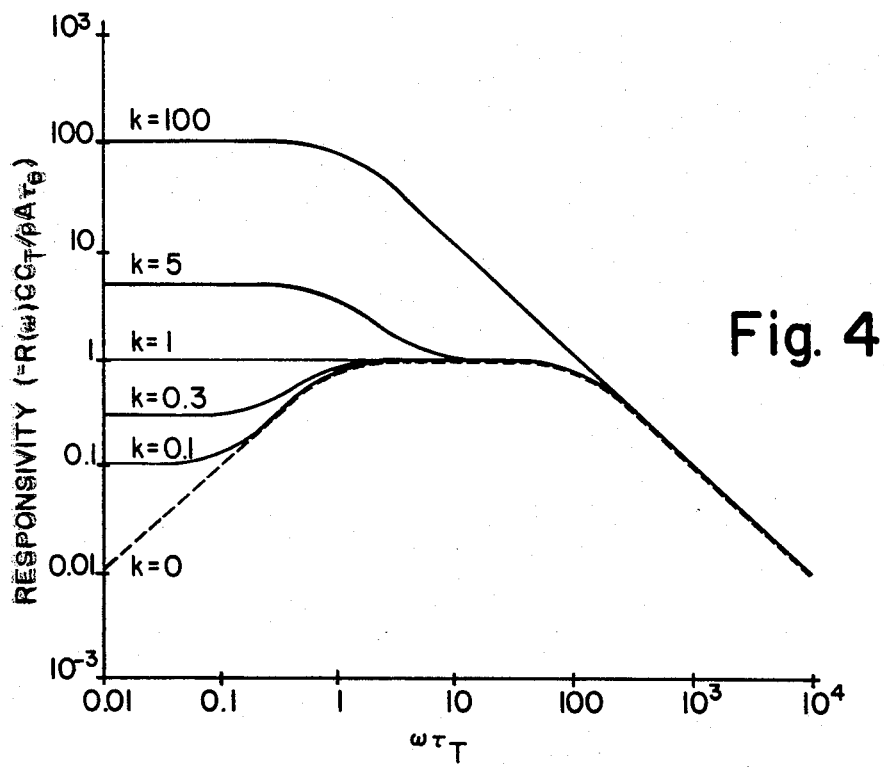
FIG. 4 is a graph of the logarithm of the responsivity (normalized by dividing it by the maximum response of the pyroelectric signal component) of a pyroelectric thermistor bolometer according to the invention versus the logarithm of the input signal frequency (normalized by multiplying the frequency by the thermal time constant, $\tau_T$). Shown in FIG. 4 are curves for several values of k, including $k=0$, which is a pyroelectric detector.

FIG. 4 shows the logarithm of the responsivity of the circuit of FIG. 2 as a function of the logarithm of the frequency, for various values of k with $\theta=0.01$. The responsivity is normalized by dividing it by $$\left(\frac{pA\tau_c}{CC_T}\right)$$

and the frequency is normalized by multiplying it by $\tau_T$, so that the graph is independent of the actual values of these parameters.

When k<<1, FIG. 4 shows that the PTB acts as a pyroelectric detector and maximum responsivity is obtained at frequencies smaller than $(1/\tau_c)$ and larger than $(1/\tau_T)$. For k>>1, the PTB acts as a thermistor and maximum response is obtained at frequencies smaller than $(1/\tau_T)$. When k=1 the response of the thermistor component to low frequencies and the frequency response of the pyroelectric component to high frequencies are combined to yield a flat frequency response from $\omega=0$ to a high frequency determined by $\tau_c$.

EXAMPLE

A thin slice of a copper-chloride boracite ($Cu_3B_7O_{13}Cl$) crystal was prepared having a thickness of 60 microns and a cross-sectional area of 0.04 square centimeters. The faces of the slice were perpendicular to the pyroelectric axis and were covered with gold electrodes. The electrodes were provided by vapor deposition.

Attached to the gold electrodes were 75 micron diameter silver leads from which the crystal was suspended. One silver lead was connected to a lead of a 50 megohm load resistor. The other silver lead was connected to a variable voltage source. The remaining terminals of the resistor and voltage source were connected to each other.

Figure 5:
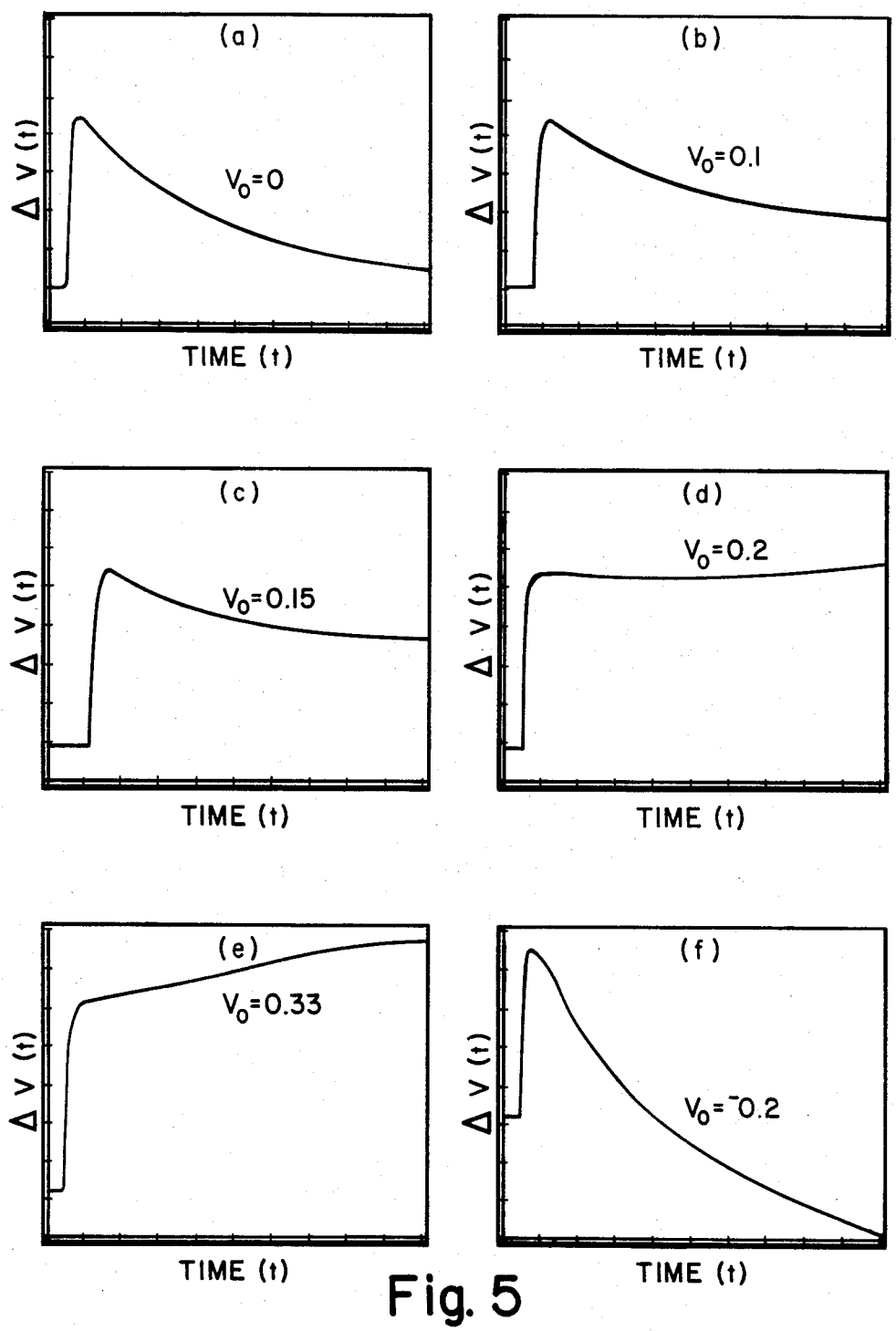
FIG. 5 is a series of oscillograms of the output voltage of the circuit of FIG. 2 in response to a step illumination of the sensing element.

The voltage across the load resistor was measured and observed on an oscilloscope in response to a step illumination of the boracite crystal for different bias voltages. FIG. 5 shows the results of these measurements. In oscillogram (a), the bias voltage, $V_o$, is zero. Consequently the circuit acts as a pyroelectric detector with a fast response which slowly decays to zero. When an increased bias voltage is applied in oscillograms (b) and (c), the thermistor component of the response contributes a slowly rising voltage which suppresses the decay of the pyroelectric response.

Finally, in oscillogram (d), the bias voltage is raised to a level where the decay of the pyroelectric signal component is substantially completely compensated by the rise in the thermistor signal component. Consequently, an approximately flat response is obtained to the step illumination.

Oscillogram (e) shows the voltage response for a bias voltage greater than that in (d). Here, the thermistor signal component rises above the pyroelectric signal component, and the circuit approaches a thermistor bolometer.

The importance of the polarity of the bias voltage is illustrated in oscillogram (f) where the bias voltage was reversed. The pyroelectric components and the thermistor component now have opposite signs, and as a result the response quickly decays and crosses the zero line.

The bias voltage necessary to obtain a value of k=1 can be calculated from equation (5.5) where $$k = \frac{\tau_T}{\tau} = 1,$$

as follows $$V_o = \frac{pA(R_o + R_L)}{\alpha \tau_T}.$$

For the copper-chloride boracite sample at room temperature, the approximate values of its relevant parameters (experimentally measured) are given in Table 1, below.

TABLE 1

| | |
|---|---|
| p = | $4.5 \times 10^{-9}$ C/cm$^2$K |
| α = | −8.8%/K |
| R$_o$ = | $1.5 \times 10^8$ ohms |
| τ$_T$ = | 1.85 sec. |

Since $R_L = 5 \times 10^7$ ohms and A = 0.04 cm$^2$, we obtain $V_o = 0.22$ V, which closely agrees with the observations of FIG. 5.

What is claimed:

1. An infrared thermal detector comprising:
   an infrared thermal sensing element comprising a pyroelectric material whose electrical conductivity changes with temperature, said sensing element having two substantially planar opposite sides on which first and second electrodes are provided, respectively;
   a load resistor having first and second electrodes, the first electrode of the load resistor being electrically connected to the first electrode of the sensing element; and
   variable voltage supply means for providing a selectable voltage across the second electrodes of the sensing element and the load resistor.

2. An infrared thermal detector as claimed in claim 1, characterized in that the load resistor is a variable resistor.

3. An infrared thermal detector as claimed in claim 2, characterized in that at the average equilibrium temperature of operation of the sensing element the ratio, k, of the thermal time constant of the sensing element to the PTB time constant of the detector is greater than zero.

4. An infrared thermal detector as claimed in claim 3, characterized in that $0.1 \leq k \leq 5$.

5. An infrared thermal detector as claimed in claim 4, characterized in that k is approximately equal to 1.

6. An infrared thermal detector as claimed in claim 5, characterized in that the sensing element has a pyroelectric axis, and the electrodes on the sensing element are substantially perpendicular to the pyroelectric axis.

7. An infrared thermal detector comprising:
   an infrared thermal sensing element comprising a pyroelectric material whose electrical conductivity changes with temperature, said sensing element having two substantially planar opposite sides on which first and second electrodes are provided, respectively;
   a variable load resistor having first and second electrodes, the first electrode of the load resistor being electrically connected to the first electrode of the sensing element; and
   voltage supply means for providing voltage across the second electrodes of the sensing element and the load resistor.

8. An infrared thermal detector as claimed in claim 7, characterized in that at the average equilibrium temperature of operation of the sensing element the ratio, k, of the thermal time constant of the sensing element to the PTB time constant of the detector is greater than zero.

9. An infrared thermal detector as claimed in claim 8, characterized in that $0.1 < k < 5$.

10. An infrared thermal detector as claimed in claim 9, characterized in that k is approximately equal to 1.

11. An infrared thermal detector as claimed in claim 10, characterized in that the sensing element has a pyroelectric axis, and the electrodes on the sensing element are substantially perpendicular to the pyroelectric axis.

12. An infrared thermal detector comprising:
    an infrared thermal sensing element comprising a pyroelectric material whose electrical conductivity changes with temperature, said sensing element having two substantially planar opposite sides on which first and second electrodes are provided, respectively;
    a load resistor having first and second electrodes, the first electrode of the load resistor being electrically connected to the first electrode of the sensing element; and
    voltage supply means for providing a voltage across the second electrodes of the sensing element and the load resistor;
    characterized in that:
    at the average equilibrium temperature of operation of the sensing element the ratio, k, of the thermal time constant of the sensing element to the PTB time constant of the detector is greater than zero.

13. An infrared thermal detector as claimed in claim 12, characterized in that:
    the thermal sensing element has a spontaneous polarization substantially in a given direction, said spontaneous polarization decreasing as the temperature of the sensor increases;
    the thermal sensing element has a temperature coefficient of resistance;
    the voltage supply means generates an electric field across the thermal sensing element and;
    the electric field across the thermal sensing element has a component in the direction of spontaneous polarization multiplied by the sign of the temperature coefficient of resistance.

14. An infrared thermal detector as claimed in claim 13, characterized in that $0.1 < k < 5$.

15. An infrared thermal detector as claimed in claim 14, characterized in that k is approximately equal to 1.

16. An infrared thermal detector as claimed in claim 15, characterized in that the sensing element has a pyroelectric axis, and the electrodes on the sensing element are substantially perpendicular to the pyroelectric axis.

17. An infrared thermal detector as claimed in claim 12, characterized in that:
    the thermal sensing element has a pyroelectric coefficient, a temperature coefficient of resistance, and a spontaneous polarization, said polarization being substantially in a given direction;
    the voltage supply means generates an electric field across the thermal sensing element; and
    the electric field across the thermal sensing element has a component in the direction of the spontaneous polarization multiplied by the sign of the temperature coefficient of resistance multiplied by the sign of the pyroelectric coefficient.

* * * * *